United States Patent
Sassa et al.

[11] Patent Number: 5,862,167
[45] Date of Patent: Jan. 19, 1999

[54] LIGHT-EMITTING SEMICONDUCTOR DEVICE USING GALLIUM NITRIDE COMPOUND

[75] Inventors: Michinari Sassa; Norikatsu Koide; Shiro Yamazaki; Junichi Umezaki; Naoki Shibata; Masayoshi Koike, all of Aichi-ken; Isamu Akasaki, 38-805,1-ban, Joshin 1-chome, Nishi-ku, Nagoya-shi, Aichi-ken, 451; Hiroshi Amano, 19-103,2-21, Kamioka-cho, Meito-ku, Nagoya-shi, Aichi-ken, 465, all of Japan

[73] Assignees: Toyoda Gosei Co., Ltd., Aichi-ken; Research Development Corporation of Japan, Saitama-key; Isamu Akasaki; Hiroshi Amano, both of Aichi-ken, all of Japan

[21] Appl. No.: 863,397

[22] Filed: May 27, 1997

Related U.S. Application Data

[63] Continuation of Ser. No. 494,022, Jun. 23, 1995, abandoned.

[30] Foreign Application Priority Data

Jul. 19, 1994 [JP] Japan .................................. 6-190069

[51] Int. Cl.$^6$ ........................................................ H01S 3/19
[52] U.S. Cl. .............................. 372/45; 372/44; 372/96; 257/98
[58] Field of Search ................................. 372/44, 45, 96; 257/103, 98

[56] References Cited

U.S. PATENT DOCUMENTS

| | | | |
|---|---|---|---|
| 5,146,465 | 9/1992 | Khan et al. | 372/45 |
| 5,226,053 | 7/1993 | Cho et al. | 372/45 |
| 5,247,533 | 9/1993 | Okazaki et al. | 372/45 |
| 5,369,289 | 11/1994 | Tamaki et al. | 257/103 |
| 5,493,577 | 2/1996 | Choquette et al. | 372/45 |

FOREIGN PATENT DOCUMENTS

| | | | |
|---|---|---|---|
| 60-130822 | 7/1985 | Japan | 372/44 |
| 5-160437 | 6/1993 | Japan | 372/44 |

OTHER PUBLICATIONS

Hecht, Understanding Lasers An Entry–Level Guide, IEEE Press, p. 262, 1994.

*Primary Examiner*—John D. Lee
*Assistant Examiner*—Yisun Song
*Attorney, Agent, or Firm*—Pillsbury Madison & Sutro LLP

[57] ABSTRACT

A light-emitting diode or laser diode is provided which uses a Group III nitride compound semiconductor satisfying the formula $(Al_xGa_{1-x})_yIn_{1-y}N$, inclusive of $0 \leq x \leq 1$, and $0 \leq y \leq 1$. A double hetero-junction structure is provided which sandwiches an active layer between layers having wider band gaps than the active layer. The diode has a multi-layer structure which has either a reflecting layer to reflect emission light or a reflection inhibiting layer. The emission light of the diode exits the diode in a direction perpendicular to the double hetero-junction structure. Light emitted in a direction opposite to the light outlet is reflected by the reflecting film toward the direction of the light outlet. Further, the reflection inhibiting film, disposed at or near the light outlet, helps the release of exiting light by minimizing or preventing reflection. As a result, light can be efficiently emitted by the light-generating diode.

5 Claims, 6 Drawing Sheets

LIGHT-EMITTING SEMICONDUCTOR DEVICE USING GALLIUM NITRIDE COMPOUND

This is a continuation of Ser. No. 08/494,022, filed Jun. 23, 1995, now abandoned.

BACKGROUND OF THE INVENTION

1. Field of the Invention

The present invention relates to a light-emitting semiconductor diode (LED) and a semiconductor laser diode which use gallium nitride (GaN) compound with a double hetero-junction structure, and which emit visible short wave rays in the blue to violet region and also in the ultraviolet region of the optical spectrum.

2. Description of Background Information

A conventional LED using a GaN compound semiconductor has been known to have a structure similar to that shown in FIG. 1. It has a sapphire substrate on which GaN compound semiconductor layers are epitaxially grown. Since the light from the emission layer of the LED is emitted equally in all directions, only a fraction of the emitted light, which is taken out through an outlet port, has been utilized. Most of the emission light has been wasted, resulting in low luminous intensity.

A conventional laser diode disclosed in U.S. Pat. No. 5,247,533 utilizes a sapphire substrate on which a double hetero-junction structure is epitaxially grown.

The double hetero-junction structure comprises indium gallium aluminum (InGaAlN) compound semiconductor layers, satisfying the formula $(Al_xGa_{1-x})_yIn_{1-y}N$ inclusive of $0 \leq x \leq 1$ and $0 \leq y \leq 1$, and an active layer not doped with any impurities which are epitaxially grown. Since the laser diode utilizes a sapphire substrate whose crystalline characteristic is different from that of the active layer, it is difficult to obtain cleavage sufficient to function as an effective mirror for the edge surface of the active layer. Consequently, the conventional GaN laser diode has a low oscillation efficiency.

SUMMARY OF THE INVENTION

It is therefore an object of the present invention to improve the emitted light efficiency of GaN compound semiconductor devices.

It is another object of the present invention to improve the planar precision of both edge surfaces of the resonator and the parallel relationship between those edge structures, resulting in better oscillation efficiency.

According to a first aspect of the invention, a light-emitting diode using Group III nitride compound semiconductor is provided satisfying the formula $(Al_xGa_{1-x})_yIn_{1-y}N$ inclusive of $0 \leq x \leq 1$ and $0 \leq y \leq 1$.

A double hetero-junction structure sandwiches an active layer between layers having wider band gaps than the active layer. The double hetero-junction structure has either a reflection layer to reflect emission light or a reflection inhibiting or preventing layer. Emission light exits the semiconductor device in a direction perpendicular to the double hetero-junction structure.

Light which is emitted in a direction opposite to the light outlet is reflected by the reflecting film or layer, resulting in more effective and efficient light emission. In addition, the reflection inhibiting film disposed at a side of the light emitting diode corresponding to the light outlet assists effective light emission preventing light reflection at or near the light outlet.

According to the second aspect of the invention, a gallium nitride group compound semiconductor laser diode is provided satisfying the formula $(Al_xGa_{1-x})_yIn_{1-y}N$, inclusive of $0 \leq x \leq 1$ and $0 \leq y \leq 1$.

The laser diode comprises a sapphire substrate, a double hetero-junction structure and first and second electrode layers.

The double hetero-junction structure sandwiches an active layer between layers having wider band gaps than the active layer, on the sapphire substrate or on a buffer layer fabricated on the sapphire substrate.

The first electrode layer comprises a reflecting film or layer and is fabricated on a top layer of the multi-layer structure.

The second electrode layer comprises a reflecting film and is fabricated beneath a lowest layer of the multi-layer structure exposed in a hole or cavity of the sapphire substrate.

The a structure comprising the first and second electrode layers sandwiching layers of the multi-layer structure functions as an oscillator, and laser light exits the laser diode a direction perpendicular or normal to the first and second electrode layers.

The oscillator of the laser diode is aligned in a direction perpendicular to the main surface of the sapphire substrate, and first and second electrode layers which are parallel to the sapphire substrate as mirrors. The surface layers of the oscillator become smooth with a high degree of planar flatness, because vapor deposition can be used to easily fabricate the layers as mirrors. As a result, the of laser output efficiency is improved.

Other objects, features, and characteristics of the present invention will become apparent upon consideration of the following description and the appended claims with reference to the accompanying drawings, all of which form a part of the specification, and wherein reference numerals designate corresponding parts in the various figures.

DETAILED DESCRIPTION OF THE EXEMPLARY EMBODIMENTS

The invention will be more fully understood by reference to the following examples.

EXAMPLE 1

Figure 1:
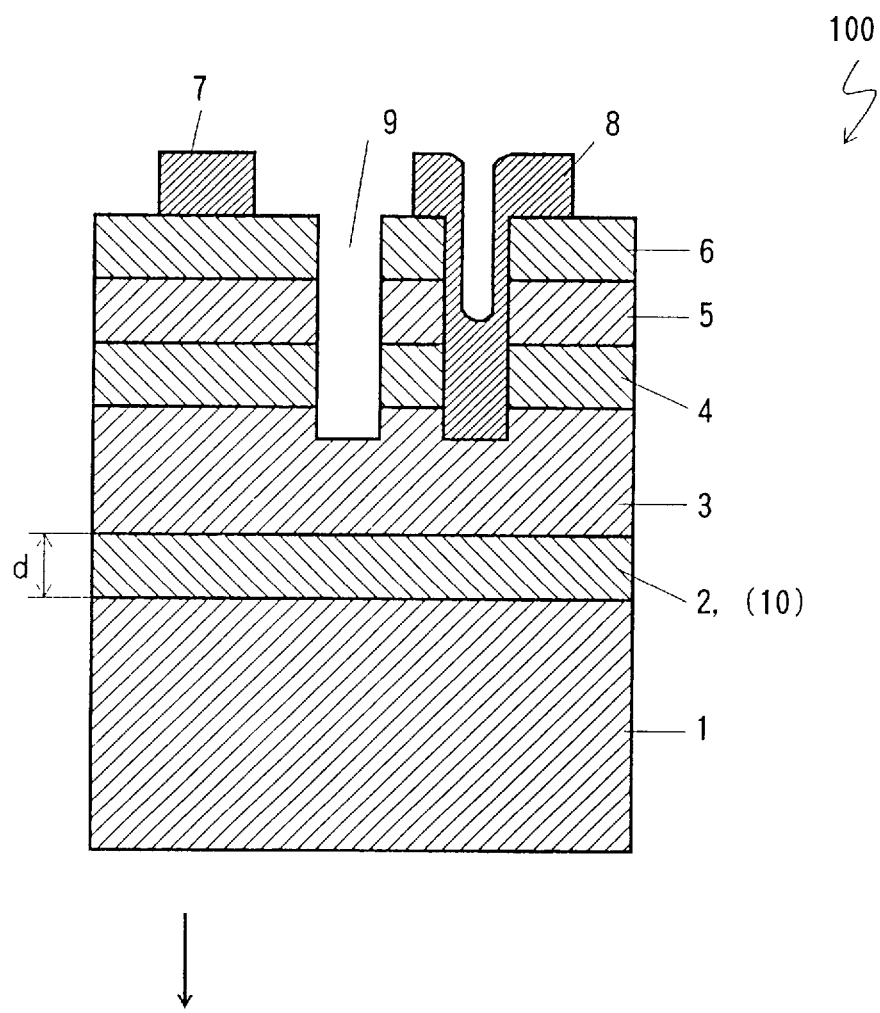
FIG. 1 is a sectional view showing the structure of the LED embodied in Example 1.

FIG. 1 shows a sectional view of a GaN compound LED 100 formed on a sapphire ($Al_2O_3$) substrate 1 upon which the following five layers are consecutively formed: an AlN buffer layer 2; a silicon (Si) doped GaN $n^+$-layer 3 of high carrier (n-type) concentration; a zinc (Zn) and Si-doped $In_xGa_{1-x}N$ layer 4 of semi-insulative or semi-p type; a ($Al_{0.1}Ga_{0.9}N$) p-layer 5 as a clad layer; and a magnesium (Mg) doped GaN layer 6 of p-type. An aluminum (Al) electrode layer 7 serves as the first electrode layer, and is formed on the GaN layer 6 of p-type. Another Al electrode layer 8 serves as the second electrode layer, and is formed through a hole extending into the GaN $n^+$-layer 3. The Al electrode layers 7 and 8 are electrically insulated from one another by a groove 9. The light emitted by the LED 10 is emitted from the backside of the device, or the side corresponding to the sapphire substrate 1, in a direction as shown by the downwardly directed arrow in FIG. 1.

In this embodiment, the AlN buffer layer 2 functions as a reflection inhibiting or preventing film 10. The light emitted from the $In_xGa_{1-x}N$ active layer 4 is emitted outwardly from the side of the sapphire substrate 1.

The emitted light was blue, with a wavelength $\lambda$ of about 485 nm wavelength $\lambda$. The thickness d of the AlN buffer layer 2, and its refractive index n have to satisfy the following equation (1) so as to function as a reflection inhibiting or preventing film 10:

$$d=\lambda/4n \quad (1)$$

Figure 2A:
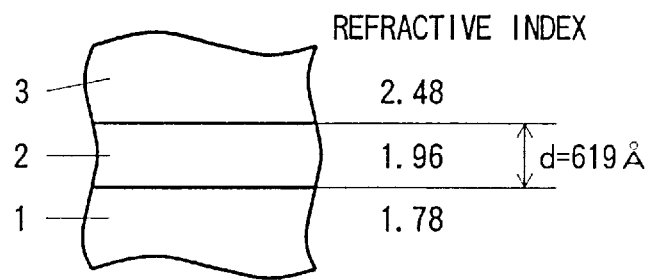
FIG. 2A is a diagram comparing the refractive index of each layer of the LED embodied in Example 1.
Figure 2B:
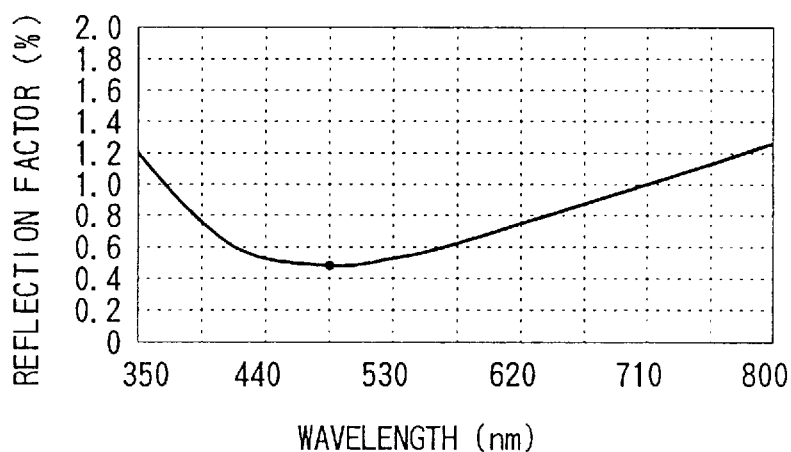
FIG. 2B is a chart showing the dependence of the reflection factor of the reflection layer on its wavelength embodied in Example 1.

Since the refractive index of the AlN buffer layer 2 is 1.96 as shown in FIG. 2A, its required thickness d is about 619 Å according to equation (1). Further, the reflection factor of the AlN buffer layer 2 with the 619 Å thickness is minimized around a 485 nm wavelength as shown in FIG. 2B. Thus, the AlN buffer layer 2 with a thickness of 619 Å transmits light most efficiently and functions as the reflection inhibiting film for light in the 440 to 530 nm region.

The GaN LED 100 of FIG. 1 is produced by the following manufacturing process.

The single crystalline sapphire substrate 1, whose main surface 'a' (1120) was cleaned by an organic washing solvent and heat treatment, was placed on a susceptor in a reaction chamber for MOVPE (metal organic vapor phase epitaxy) treatment. After the chamber was evacuated, the sapphire substrate 1 was etched at 1200° C. by a vapor of $H_2$ fed into the chamber under normal pressure. As a result, any hydrocarbon group gas molecules previously attached to the surface of the sapphire substrate 1 were removed.

About a 619 Å thick AlN buffer layer 2 was epitaxially grown on the sapphire substrate 1 under conditions of lowering the temperature of the sapphire substrate 1 to 600° C., keeping the temperature constant, and supplying trimethyl aluminum ($Al(CH_3)_3$) (TMA hereinafter) and ammonia ($NH_3$).

On the buffer layer 2, Si-doped GaN $n^+$-layer 3 was formed under conditions of raising the temperature of the sapphire substrate 1 up to 1040° C., stopping supplying only TMA, and additionally supplying trimethyl gallium ($Ga(CH_3)_3$) (TMG hereinafter) and silane ($SiH_4$).

Then, about a 0.4 $\mu$m thick indium (In) doped $In_{0.1}Ga_{0.9}N$ layer 4 was formed on the GaN $n^+$-layer 3 by supplying trimethyl indium ($In(CH_3)_3$) (TMI hereinafter), TMG, and $SiH_4$.

About a 0.4 $\mu$m thick magnesium (Mg) doped $Al_{0.1}Ga_{0.9}N$ active layer 5 was formed on the $In_{0.1}Ga_{0.9}N$ layer 4 by supplying TMA, TMG, and biscyclopentadienyl magnesium ($Mg(C_5H_5)_2$) ($CP_2Mg$ hereinafter).

About a 0.4 $\mu$m thick Mg-doped GaN p-layer 6 was formed on the active layer 5 by supplying TMG and $CP_2Mg$.

Then, the wafer was transferred into a vacuum chamber, and electron rays were irradiated into the p-layer 6 and the active layer 5. This irradiation changed those layers 5 and 6 into p-type conductive layers.

Typical irradiation conditions are:

15 KV for the electron accelerating voltage;

120 $\mu$A or more for the emission current;

60 $\mu$m$\phi$ for the electron spot diameter; and

297° K. for the sample temperature.

Subsequently, about a 200 nm thick Al electrode 7 was formed on the GaN p-layer 6 as the first electrode layer, and a 200 nm thick Al electrode 8 was formed through the insulated region by the groove 9 contacting the $n^+$-layer 3. These electrode layers 7 and 8 are the electrodes of the device 100.

Several devices treated with the above-described process at a time on a wafer were divided into each element by a diamond cutter. When voltage is applied to the Al electrode layers 7 and 8, a light is emitted from the $In_xGa_{1-x}N$ active layer 4 to the outlet port at the side of the sapphire substrate 1. Since the reflection factor of the Al electrode layer 7 is 100%, the light reflected by the layer 7 is also transmitted through the outlet port at the side of the sapphire substrate 1.

EXAMPLE 2

Figure 3:
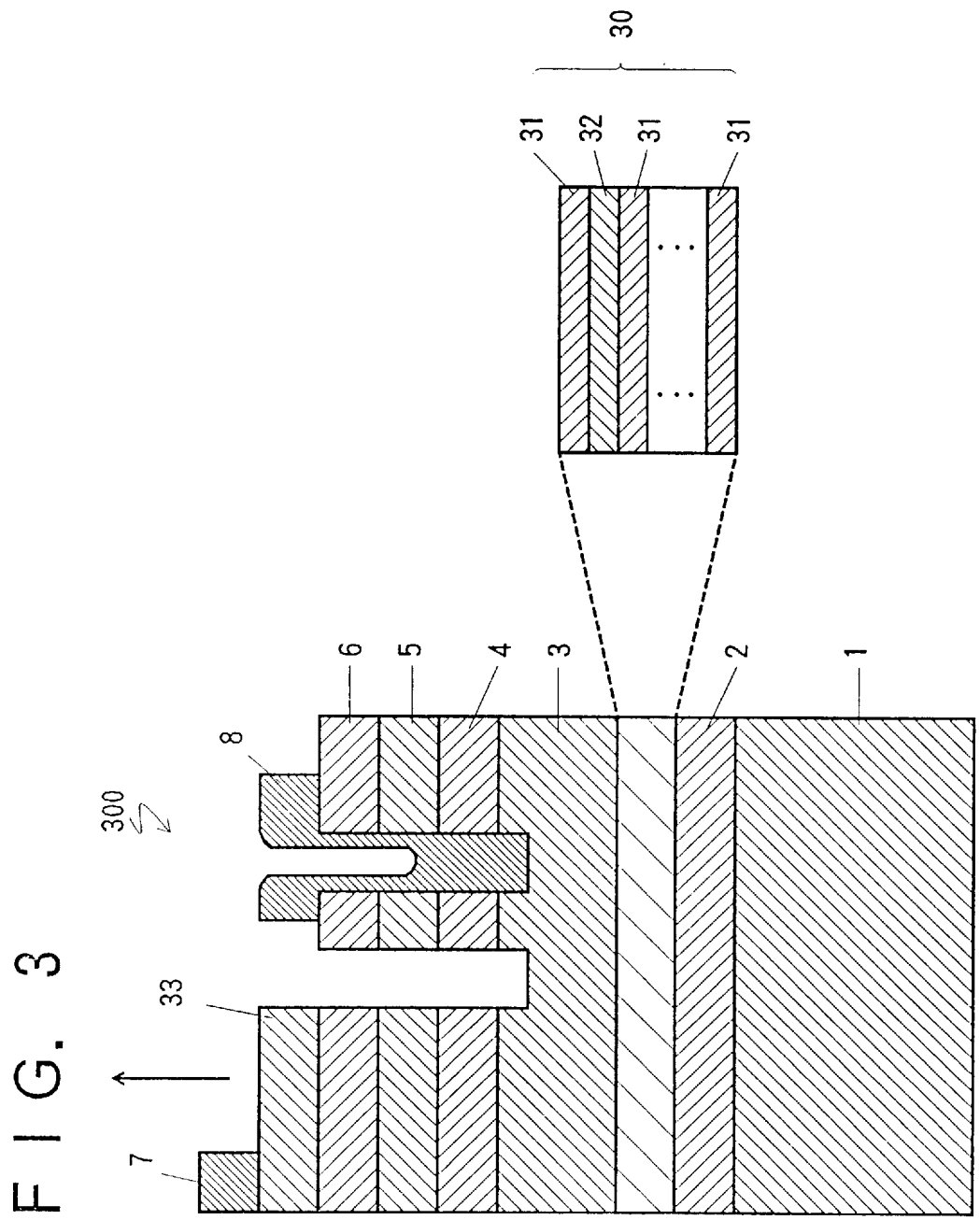
FIGS. 3 to 5 are sectional views showing the structure of the LED embodied in Example 2 to 4, respectively.

FIG. 3 shows an LED 300 which has a reflection layer 30 comprising a multi-layer structure of $Al_{0.1}Ga_{0.9}N$ layers 31 and GaN layers 32 on the AlN buffer layer 2. Light exits through the outlet port at a side of the device corresponding to an upper electrode layer 33 which is made of a transparent indium tin oxide (ITO) film 33. The Al electrode 7 is formed contacting a portion of the ITO film 33. The refractive index of the reflecting film 30 must be large so as to reflect the light emitted from an $In_xGa_{1-x}N$ active layer 4 towards the side of the ITO film 33. Accordingly, the reflecting film 30 was made of a multi-layer structure of the $Al_{0.1}Ga_{0.9}N$ layers 31 and the GaN layers 32. They were alternately fabricated a selected number of times. The refractive index $n_2$ of the $Al_{0.1}Ga_{0.9}N$ is 2.426 and that $n_1$ of GaN is 2.493. The difference between the $n_2$ and $n_1$ is small. Substituting 1.78 as the refractive index of the sapphire substrate 1, the reflection factor $R_{2N}$ is obtained by the following equation (2)

$$R_{2N} = \left( \frac{(1-(n_S/n_0)\,(n_1/n_2)^{2N})}{(1+(n_S/n_0)\,(n_1/n_2)^{2N})} \right)^2 \quad (2)$$

The thickness of each layer, 31 and 32, is designed to have a high reflection factor. As a result, the optimum thickness of the $Al_{0.1}Ga_{0.9}N$ layer 31 was 46.37 nm and that of the GaN layer 32 was 45.63 nm.

According to the equation (2), the constituent number N of the multi-structure layers alters the reflection factor of the LED 300. When N was 30, the reflection factor was 64.40%. When N was 50, the reflection factor was 86.29%.

EXAMPLE 3

Figure 4:
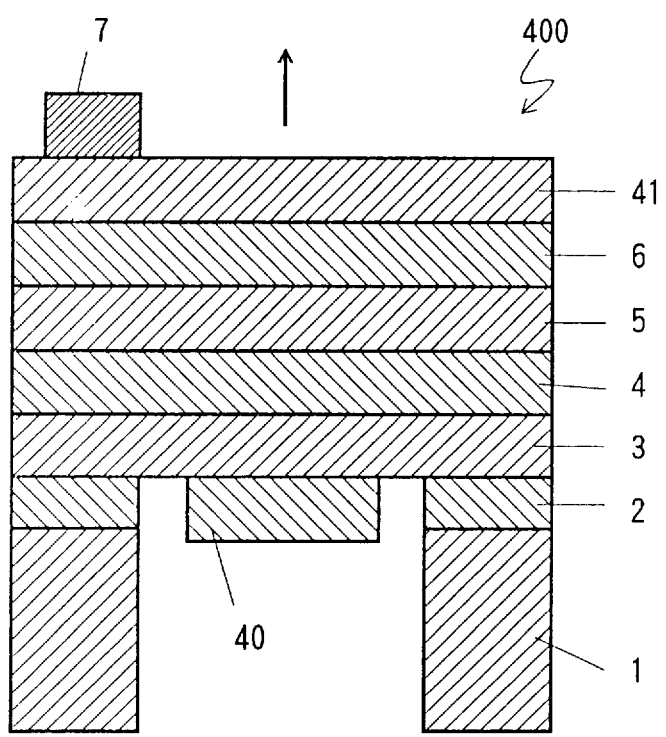

FIG. 4 shows an LED 400 whose emission light exits from its upper side as indicated by the upwardly directed bold arrow. After each layer was epitaxially grown, a cavity or hole was formed at the backside of the sapphire substrate 1 extending to some portion of the Si-doped GaN $n^+$-layer 3. An Al electrode 40 was formed on the exposed portion of the $n^+$-layer 3 and was separated and spaced from the AlN buffer layer 2 as a precaution against the leakage of electric current. A metal electrode 40 was formed to have 100% reflection factor so as to reflect all of the emitted light toward the upper side of the LED 400.

The LED 400 has a structural advantage. Since the metal electrode 40 is formed in the hole of the sapphire substrate 1, a space around the metal electrode 40 is obtained when the LED 400 is attached to a base. This space, when utilized for connecting leads, enables the LED 400 to have a larger emission area on its upper part.

EXAMPLE 4

Figure 5:
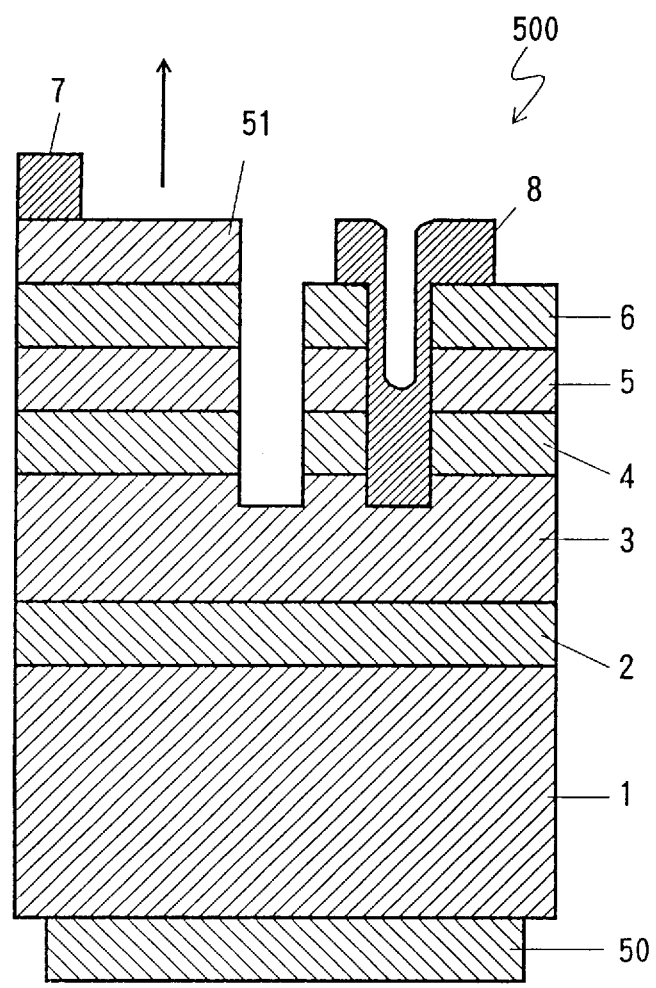

FIG. 5 shows an LED 500 whose emission light exits from its upper surface plane as shown by the bold upwardly directed arrow. A metal reflecting layer 50 formed on the backside of the sapphire substrate 1 does not function as an electrode. Accordingly, the electrodes of the LED 500 were formed in the same manner as those of the LEDs 100 and 300 in FIGS. 1 and 3, respectively.

The metal reflecting layer 50 is useful. Since the sapphire substrate 1 is transparent to the light emitted from the LED 500, the light reflected by the metal reflecting layer 50 beneath the sapphire substrate 1 is transmitted to the emission plane with little attenuation when the light passes through the sapphire substrate 1. Further, the fabrication of the layer 50 is straight forward, because it is formed at the backside of the sapphire substrate 1.

The following alternatives are possible for Examples 1 to 5:

The reflecting layer or the reflection inhibiting layer can be made of $Al_xGa_{1-x}N$ inclusive $0 \leq x \leq 1$.

The reflecting layer or the reflection inhibiting layer can be a multi-layer structure made of $Al_{x1}Ga_{1-x1}N$ and $Al_{x2}Ga_{1-x2}N$ inclusive $x1 \neq x2$, $0 \leq x1 \leq 1$, and $0 \leq x2 \leq 1$.

When the reflecting layer has a multi layer structure's layer structure, one of the multi-layer is designed to have a larger refractive index than another adjacent layer which is fabricated at aside opposite to the device's light outlet.

The electrode layer can be made of a metal layer.

The reflecting layer can be made of a metal layer and fabricated beneath the insulating substrate of the LED.

In the claims, the description, a double hetero-junction structure, comprises layers made of several elements based on GaN such as aluminum gallium nitride ($Al_{0.1}Ga_{0.9}N$), indium gallium nitride ($In_{0.1}Ga_{0.9}N$), and so forth.

EXAMPLE 5

Figure 6:
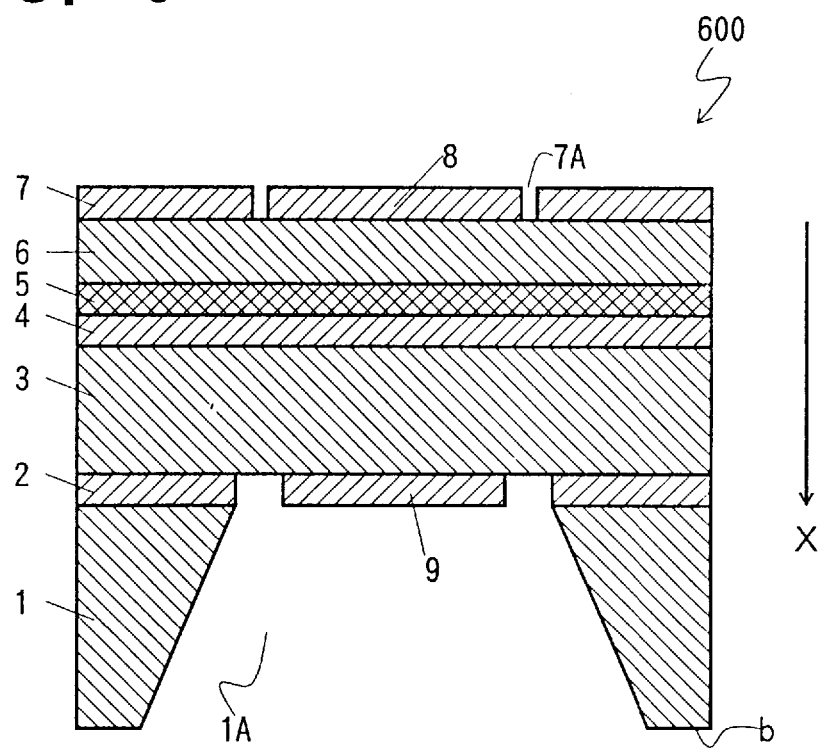
FIG. 6 is a sectional view showing the structure of the laser diode embodied in Example 5.

FIG. 6 is a sectional view of a laser diode 600 utilizing a sapphire substrate 1. Its manufacturing process is described hereinafter.

The sapphire substrate 1 formed of single crystalline, whose main surface "a" (1120) was cleaned by an organic washing solvent and heat treatment, was placed on a susceptor in a reaction chamber for MOVPE treatment. After the chamber is evacuated, the sapphire substrate 1 was etched at 1200° C. by a vapor of $H_2$ fed into the chamber under normal pressure. As a result, hydrocarbon group gas molecules previously attached to the surface of the sapphire substrate 1 were removed to some extent.

About a 50 nm thick aluminum nitride (AlN) buffer layer 2 was epitaxially grown on the sapphire substrate 1 under conditions of lowering the temperature of the sapphire substrate 1 up to 600° C., keeping the temperature constant, and supplying TMA and $NH_3$.

On the buffer layer 2, Si-doped GaN $n^+$-layer 3 which would be the lowest layer in position was formed under conditions of raising the temperature of the sapphire substrate 1 to 1040° C., stopping supplying only TMA, and additionally supplying TMG, and $SiH_4$.

Then, about a 0.4 $\mu$m thick Si-doped $Al_{0.1}Ga_{0.9}N$ layer 4 was formed on the $n^+$-layer 3 by supplying TMA, TMG, and $SiH_4$.

About a 0.2 $\mu$m thick GaN active layer 5 was formed on the n-layer 4 by supplying TMG.

About a 0.4 $\mu$m thick Mg-doped $Al_{0.1}Ga_{0.9}N$ p-layer 6, which would be the surface layer, was formed on the active layer 5 by supplying TMA, TMG, and $CP_2Mg$.

After a $SiO_2$ layer 7 was formed on the p-layer 6, a strip-like window 7A of 1 mm$\phi$ was formed. Another 1 mm$\phi$ hole 1A exposing some portion of the Si-doped GaN layer 3 was formed by removing a portion of the backside b of the sapphire substrate 1 and by reflective ion etching (RIE) treatment to form a cavity.

Then, the wafer was transferred into a vacuum chamber, and electron rays were irradiated into the Mg-doped p-layer 6 and the Mg-doped active layer 5 under the condition as same as that described in Example 1. This irradiation changed those layers 5 and 6 into p-type conductive layers.

Subsequently, about a 2000 Å thick aluminum (Al) electrode layer 8 which is the first electrode layer was formed through the strip-like window 7A contacting the $Al_{0.1}Ga_{0.9}N$ p-layer 6. About a 800 Å thick Al electrode layer 9 which is the second electrode layer was formed in the hole 1A contacting the Si-doped GaN n-layer 3. These aluminum electrode layers 8 and 9 function as mirrors for the both ends of the laser resonator.

Several devices on the sapphire substrate 1 were treated with the above-described process at a time, and were divided into separate pieces by a diamond cutter. When voltage is applied to the Al electrode layers 8 and 9, the laser diode 600 of the illustrate present invention oscillates toward the direction of the X-axis, or in a direction perpendicular to the plane of the sapphire substrate 1. The oscillated laser is output from the periphery of the Al electrode layer 9 whose reflection factor is 80%. 100% of the reflection factor of the Al electrode layer 8 is almost realized.

Accordingly, the laser 600 with a longitudinal-type resonator was obtained.

Aluminum was used for the electrode layers. Alternatively, a double layer structure of a 350 Å thick GaN layer and a 350 Å thick AlGaN layer, or a $SiO_2$ layer and a $TiO_2$ layer can be used. Further, altering the number of the double layer structure or the thickness of each of the component layers enables control of the reflection factor.

The etching time of the sapphire substrate 1 can be shortened by polishing its backside "b" beforehand.

Forming several dot type electrodes on one layer enables the laser diode 600 to emit light in dots, or to form a dot matrix display on a plane.

While the invention has been described in connection with what are presently considered to be the most practical and preferred embodiments, it is to be understood that the invention is not to be limited to the disclosed embodiments, but on the contrary, is intended to cover various modifications and equivalent arrangements such as are included within the spirit and scope of the appended claims.

What is claimed is:

1. A gallium nitride Group compound semiconductor laser diode satisfying the formula $(Al_xGa_{1-x})_yIn_{1-y}N$, inclusive of $0 \leq X \leq 1$, and $0 \leq Y \leq 1$, said laser diode comprising:
   a substrate;
   a multi-layer having a double hetero-junction structure sandwiching an active layer between layers having wider band gaps than said active layer formed on one of said substrate and a buffer layer fabricated on said substrate;

a first electrode layer made of a reflecting film and fabricated on a top layer of said multi-layer;

a second electrode layer made of a reflecting film, said second electrode layer being fabricated beneath a lowest layer of said multi-layer and being exposed in a hole of said substrate; and wherein a combined structure comprising said first and second electrode layers and layers of said multi-layer sandwiched between said first and second electrode layers functions as a cavity of said semiconductor laser diode, and wherein a laser light exits from said laser diode in a direction perpendicular to said first and second electrode layers.

2. A laser diode according to claim 1, wherein said substrate is sapphire.

3. A light-emitting diode using Group III nitride compound material satisfying the formula $(Al_xGa_{1-x})_YIn_{1-Y}N$, inclusive of $0 \leq X \leq 1$, and $0 \leq Y \leq 1$, said light-emitting diode comprising:

a substrate;

a multi-layer having a double hetero-junction structure sandwiching an active layer between layers having wider band gaps than said active layer, said double hetero-junction structure being on one of said substrate and a buffer layer fabricated on said substrate;

a first electrode layer fabricated on a top layer of said multi-layer;

a second electrode layer made of a reflecting film, said second electrode layer being fabricated beneath a lowest layer of said multi-layer and being exposed in a hole of said substrate; and wherein light exits from a side of said first electrode in a direction perpendicular to said first and second electrode layers.

4. A light-emitting diode according to claim 3, wherein said first electrode layer is transparent and a plane parallel to said second electrode layer.

5. A light-emitting diode according to claim 3, wherein said substrate is sapphire.

* * * * *